United States Patent [19]

Ozawa

[11] 4,385,433
[45] May 31, 1983

[54] METHOD OF FORMING METAL SILICIDE INTERCONNECTION ELECTRODES IN I²L-SEMICONDUCTOR DEVICES

[75] Inventor: Osamu Ozawa, Yokohama, Japan
[73] Assignee: Tokyo Shibaura Denki Kabushiki Kaisha, Japan
[21] Appl. No.: 204,952
[22] Filed: Nov. 7, 1980

[30] Foreign Application Priority Data

Nov. 10, 1979 [JP] Japan .............................. 54-145725

[51] Int. Cl.³ .......................... C23F 1/02; B01J 17/00
[52] U.S. Cl. .................................. 29/576 B; 29/571; 148/1.5; 148/187; 357/15; 357/67; 357/91
[58] Field of Search ................... 148/1.5, 187; 29/571, 29/576 B; 357/15, 91, 67

[56] References Cited

U.S. PATENT DOCUMENTS

| | | | |
|---|---|---|---|
| 3,846,192 | 11/1974 | Murrmann | 427/84 |
| 3,938,243 | 2/1976 | Rosvold | 427/84 |
| 3,956,527 | 5/1976 | Magdo et al. | 427/84 |
| 4,074,304 | 2/1978 | Shiba | 357/65 |
| 4,107,835 | 8/1978 | Bindell et al. | 29/590 |
| 4,114,256 | 9/1978 | Thibault et al. | 29/590 |
| 4,141,022 | 2/1979 | Sigg | 357/67 |
| 4,156,246 | 5/1979 | Pedersen | 357/15 |
| 4,209,349 | 6/1980 | Ho et al. | 148/187 |
| 4,283,236 | 8/1981 | Sirsi | 148/1.5 |
| 4,283,439 | 8/1981 | Higashinakagawa et al. | 427/93 |
| 4,343,082 | 8/1982 | Lepstetter et al. | 148/1.5 |

OTHER PUBLICATIONS

Currie et al., IBM-TDB, 20, (1978), 5178.
Knepper, IBM-TDB, 17, (1974), 1609.
Anantha et al., IBM-TDB, 21, (1979), 3630.

*Primary Examiner*—Upendra Roy
*Attorney, Agent, or Firm*—Finnegan, Henderson, Farabow, Garrett & Dunner

[57] ABSTRACT

An exposed surface of a semiconductor substrate with an integrated injection logic semiconductor region having a first conductivity injector region of which one surface is exposed, a first conductivity type base region of which part of the surface is exposed, and a second conductivity type collector region of which one surface is exposed and the remaining surfaces are surrounded by the base region, is covered with SiO$_2$. Contact holes are holed in the SiO$_2$ layer at the locations facing the injector regions, the base regions and the collector region. Through the contact holes, first conductivity type ions are injected into the semiproduct of the semiconductor device. As a result, the surface impurity concentrations of the injector region, the base region and the collector region are $1 \times 10^{19}/cm^3$ or more. Interconnection electrodes of, for example, MoSi$_2$ make ohmic contact with the respective regions.

3 Claims, 6 Drawing Figures

METHOD OF FORMING METAL SILICIDE INTERCONNECTION ELECTRODES IN I²L-SEMICONDUCTOR DEVICES

BACKGROUND OF THE INVENTION

The present invention relates to a manufacturing method of semiconductor devices with interconnection electrodes made of silicide of high melting point metal.

In manufacturing a semiconductor intergrated circuit with multilayered interconnections, an Al interconnection as a first layer can not withstand a high temperature treatment in the manufacturing process of the semiconductor device. The substitution of the Al interconnection by a polysilicon interconnection suffers from high resistivity. In this respect, a proposal in which silicide of high melting point metal such as molybdenum silicide MoSi₂ is used for the interconnection layer, has recently received considerable attention. The proposal, however, has a problem in that when the MoSi₂ layer is used for the interconnection electrode, it is hard to form good ohmic contact of it with a semiconductor region with low impurity concentration, for example, $10^{19}/cm^3$ or less. The inventor of the present invention proposed an inventive method in which a polysilicon layer is formed on a semiconductor layer and an MoSi₂ layer is further formed on the polysilicon layer. This proposal successfully attained good ohmic contact between the semiconductor region on which the interconnection is formed and the MoSi₂ layer with the polysilicon layer intervening therebetween. This proposal has also some disadvantages. First, the provision of the polysilicon layer needs steps to diffuse n-type impurity material into the polysilicon layer disposed facing an n-type semiconductive region and a step to diffuse p-type impurity material into the polysilicon layer disposed facing the p-type semiconductor region. The diffusing steps make the manufacturing process complicated. Second, in etching the MoSi₂ layer layered on the polysilicon layer to a given reduced dimensional layer, a difference of the etching characteristic between them makes it difficult to accurately form the interconnection. As a result, it is difficult to improve an integration density of the integrated circuit.

SUMMARY OF THE INVENTION

Accordingly, an object of the present invention is to provide a manufacturing method of a semiconductor device with an interconnection made of silicide of high melting point metal with a configuration that allows good ohmic contact between a semiconductor region necessary for the interconnection and the silicide of high melting point metal by using an extremely simple process.

Another object of the present invention is to provide a manufacturing method of an integrated injection logic semiconductor device with interconnections of silicide of high melting point metal with a configuration that allows good ohmic contact between a semiconductor region necessary for the interconnection and the metal silicide with high melting point by using an extremely simple process.

According to one aspect of the present invention, there is provided a manufacturing method of a semiconductor device comprising the steps of: forming an insulating layer on one surface of a semiconductor substrate having a first semiconductor region with a first impurity concentration formed on the surface; forming contact holes in the insulating layer at a location facing the first semiconductor region; forming a second semiconductor region with a second impurity concentration on the first semiconductor region by injecting ions onto the first semiconductor region through the contact holes; and forming interconnection electrodes made of silicide of high melting point metal on the second semiconductor region.

In another aspect of the invention, there is provided a manufacturing method of an integrated injection logic semiconductor device comprising the steps of: forming an insulating layer on the entire exposed surface of a semiconductor substrate of a second conductivity type for forming an integrated injection logic, having a first conductivity type injector region formed within the second conductivity type semiconductor region whose one surface is exposed, a first conductivity type base region formed so as to face the injector region through part of the second conductivity type semiconductor region and to be exposed at part of the surface thereof, and at least one second conductivity type collector region, of which one surface is exposed and the remaining ones are surrounded by the base region; forming contact holes in the insulating layer at the locations, respectively, facing the injector region, the base region and the exposed surface of the collector region; forming first, second and third semiconductor regions with first, second and third impurity concentrations on the exposed surfaces of the injector region, the base region and the collector region by injecting the first conductivity type ions through the contact holes; and forming interconnection electrodes made of silicide of high melting point metal on the first, second and third semiconductor regions, respectively.

Other objects and features of the present invention will be apparent from the following description taken in connection with the accompanying drawings:

DETAILED DESCRIPTION OF THE PREFERRED EMBODIMENTS

Figure 1:
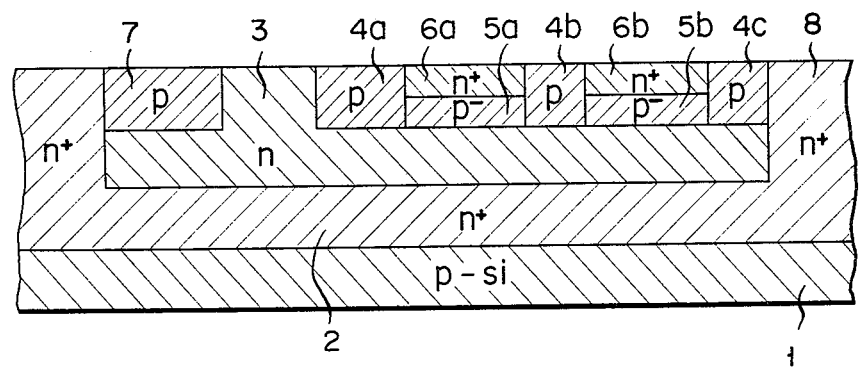
FIG. 1 shows a cross sectional view of a semiconductor substrate with semiconductor regions for forming an integrated injection logic.

An embodiment of the manufacturing method of a semiconductor device according to the present invention will be described referring to FIGS. 1 to 5. The embodiment is a case that the manufacturing method is applied for manufacturing I²L (integrated injection logic) semiconductor device. The semiconductor regions shown in FIG. 1 are formed by a known method. Accordingly, no elaboration of them will be necessary but a brief description thereof will be given for a better understanding of the present invention.

Firstly, an n+ buried layer 2 is formed in a p-type Si substrate 1 and an n-region 3 is further formed on the n+ buried layer 2 by the epitaxial growing method. A p-type injection region 7 is formed within the n-region 3, exposing one surface thereof. Then, external base regions 4a, 4b and 4c of the p-type are formed within the n-region 3. The external base regions 4a and 4b, in cooperation with internal base regions 5a and 5b of the p⁻-type, surround three surfaces of a first collector region 6a of the n+-type exposing one surface thereof. The external base regions 4b and 4c in cooperation with the internal base regions 5b, similarly surrounds three surfaces of a second collector region 6b of the n+-type. Thus, the base of the semiconductor device has a double base structure of p and p⁻. At least one collector region is provided in the semiconductor device. A collar region 8, provided at the peripheral end of the n+-region 2, electrically separates one I²L semiconductor device from another. The collector regions 6a and 6b have each an impurity concentration of approximately $1 \times 10^{21}/cm^3$. The base regions 4a and 4b and the injector region 7 have each an impurity concentration of approximately $5 \times 10^{18}/cm^3$.

Figure 2:
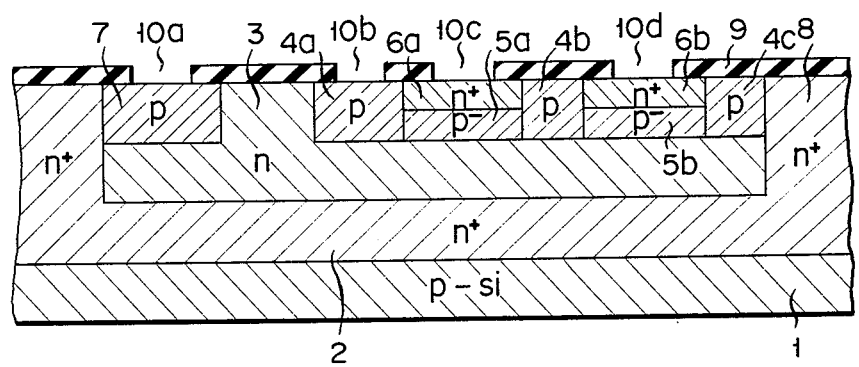
FIG. 2 shows a cross sectional view of the semiproduct of a semiconductor device in which given contact holes are formed in an insulating layer on the exposed surface of the semiconductor region shown in FIG. 1 by means of the manufacturing method according to the present invention.

After forming the respective semiconductor regions on the semiconductor substrate by the known process, as illustrated in FIG. 1, FIG. 2 shows an insulating layer 9 such as an SiO₂ layer formed on the semiconductor substrate and then holed to have contact holes 10a to 10d arranged corresponding to the injector region 7, the external base region 4a, and the collector regions 6a and 6b. The manufacturing process as described above up to the holing step shown in FIG. 2 is well known. After the step of FIG. 2, it is impossible to form an interconnection electrode of MoSi₂, for example, through the contact holes. Specifically, the impurity concentration of the regions 6a and 6b is about $1 \times 10^{21}/cm^3$. Therefore, the interconnection electrode may be applied for the regions 6a and 6b. However, it can not be applied for the regions 7 and 4a because the impurity concentration of those regions is about $5 \times 10^{18}/cm^3$.

Figure 3:
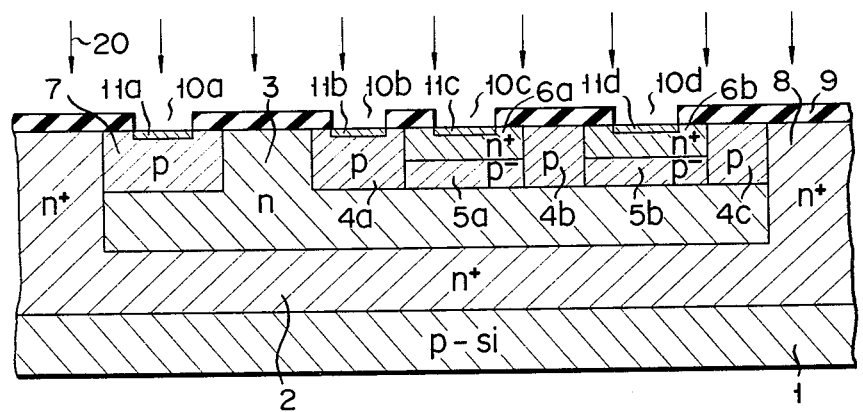
FIG. 3 shows a cross sectional view for illustrating the step to inject ions through the contact holes shown in FIG. 2 according to the present invention.

To solve this problem, the manufacturing method of the present invention injects p-type ions such as boron ions at the dosage $5 \times 10^{15}/cm^2$ or more over the entire surface of the semiconductor device, as indicated by reference numeral 20 in FIG. 3. The reason why the p-type ions are injected over the entire surface of the semiproduct is for simplifying the manufacturing process of the semiconductor device. Following the injection, it is annealed at 900° C. in N₂ atmosphere for 30 minutes thereby to activate the injected ions. As a result of the ion injection, p+-regions 11a and 11b are formed on the injector region 7 and the external base region 4a, respectively, while regions 11c and 11d are formed on the collector regions 6a and 6b, respectively. The dosage of boron is so selected as not to invert the conductivity type of the collector regions 6a and 6b and corresponds to $5 \times 10^{19}/cm^3$ in terms of the impurity concentration. Through the above process, the impurity concentration of the regions 11a to 11d is $1 \times 10^{19}/cm^3$ or more thereby to allow it to make an ohmic contact with the MoSi₂ electrode.

Figure 4:
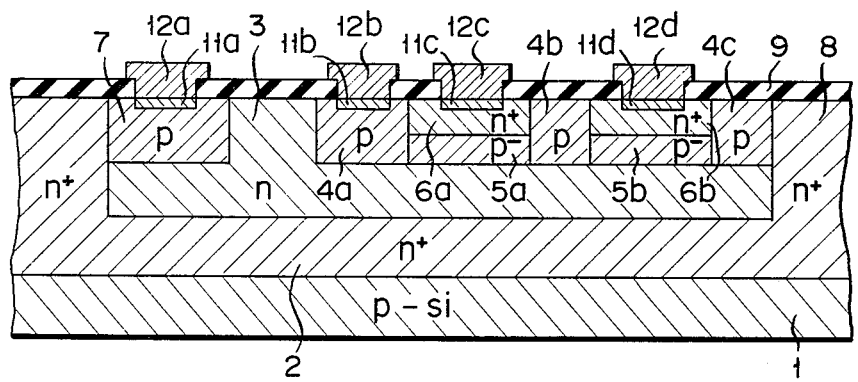
FIG. 4 shows a cross sectional view of the semiconductor device when interconnection electrodes made of silicide of high melting point metal are formed on an additionally formed semiconductor region by the method illustrated in FIG. 3.

Turning now to FIG. 4, there is shown a cross sectional view when MoSi₂ interconnection electrodes 12a to 12d are formed. The interconnection electrodes 12a to 12d are formed in a manner that Mo and Si are simultaneously vacuum-deposited over the entire surface of the MoSi₂ layer and then are patterned by the plasma etching process. Those interconnection electrodes serve as a first layer interconnection electrode of the semiconductor device with multilayered interconnections. To decrease the resistance of the first layer interconnection electrodes, the annealing step is additionally used.

Figure 5:
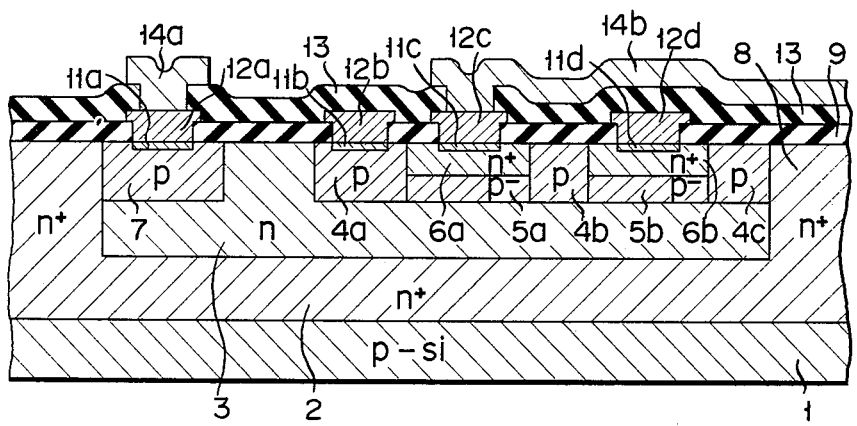
FIG. 5 shows a cross sectional view of the semiconductor device when interconnection electrodes are further formed above the interconnection electrodes shown in FIG. 4.

In forming a second layered interconnection electrode, a CVD (chemical vapor deposition) oxide layer or a polyimide region layer 13 is deposited over the entire surface of the semiproduct and then is holed at given locations thereof to have contact holes. At the next step, second layer interconnection electrodes 14a and 14b of aluminum are formed through the contact holes, as shown in FIG. 5. When forming the I²L circuit, a potential drop in the injector circuit is particularly problematic. To avoid this, it is preferable to form an Al interconnection electrode 14a superposed on the MoSi₂ interconnection electrode 12a, as shown. Assuming that an injection current to one injector is Iing and a resistance of the interconnection electrode to supply this Iing is R, it is desirable that the following relation holds:

$$Iing \times R < 0.2 \text{ V}$$

As seen from the foregoing, the manufacturing method of the invention increases the impurity concentration in the surface regions of the low impurity regions by injecting the ions over the entire surface of the semiproduct, after the contact holes are formed, and then forms the interconnection electrodes of MoSi₂. Therefore, good ohmic contacts are secured between the interconnection electrodes and the given semiconductor regions. When compared to the interconnection electrodes using both the polysilicon layer and the MoSi₂, the process for manufacturing the semiconductor device according to the present invention is extremely simple. Additionally, the interconnection electrodes may be finely worked by the manufacturing method of the present invention, with the result that a high density integration is possible. In addition to Mo silicide, the silicide of high melting point metal used in the invention includes W silicide, Nb silicide, Ti silicide, and Ta silicide. The material for the second layer interconnection electrodes is not limited to aluminum. The manufacturing method of the present invention, which has been described as the application of it into the manufacturing of the I²L semiconductor device is applicable for the manufacturing method of various bipolar integrated circuits requiring multilayered interconnection electrodes. It is evident that when the first layer interconnection electrodes are formed on a p-type semiconductor region with low impurity concentration and a p+-type semiconductor region with high impurity concentration, ions of the n-conductivity type are injected thereinto.

Figure 6:
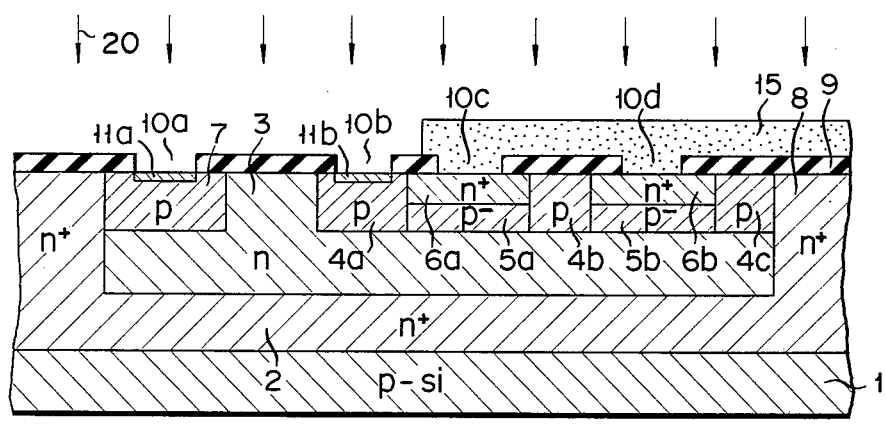
FIG. 6 shows a cross sectional view of another semiproduct of a semiconductor device made by means of the manufacturing method according to the present invention.

FIG. 6 shows another embodiment of the manufacturing method of the semiconductor device according to the present invention. In FIG. 6, after the contact holes 10c and 10d are covered with a photoresist layer 15, boron is injected over the semiproduct and then p+-regions 11a and 11b are formed only on p-type regions 7 and 4a, respectively. After this step, a photoresist layer 15 is removed by a known process. Then, an MoSi₂ layer is provided by the process as mentioned relating to FIG. 4. The present embodiment provides an increased number of manufacturing steps but is free from a limit of the dosage of boron ions.

What is claimed is:

1. A manufacturing method of an integrated injection logic semiconductor device comprising the steps of:

forming an insulating layer on a surface of a semiconductor substrate of a second conductivity type for forming an integrated injection logic, having a first conductivity type injector region formed within a second conductivity type semiconductor region whose one surface is exposed, a first conductivity type base region formed so as to face the injector region through part of said second conductivity type semiconductor region and to expose a part of the surface thereof, and at least one second conductivity type collector region formed, of which one surface is exposed and the remaining ones are surrounded by the base region;

forming contact holes in the insulating layer at the locations, respectively, facing said injector region, the base region and the exposed surface of the collector region;

forming first, second and third semiconductor regions with first, second and third impurity concentrations on the exposed surfaces of said injector region, the base region and the collector region by injecting first conductivity type ions through the contact holes, the impurity concentrations of said first, second and third semiconductor regions being $1 \times 10^{19}/cm^3$ or more; and forming interconnection electrodes made of silicide of high melting point metal on said first, second and third semiconductor regions.

2. A manufacturing method of an integrated injection logic semiconductor device as claimed in claim 1, wherein said silicide of high melting point metal is a silicide selected from the group consisting of Mo, W, Nb, Ti and Ta silicides.

3. A manufacturing method of an integrated injection logic semiconductor device as claimed in claim 1, wherein a dosage of said injecting ions is selected within a range for preventing the conductivity type of said collector region from being inverted.

* * * * *